United States Patent
Miyadera

(10) Patent No.: US 7,208,872 B2
(45) Date of Patent: Apr. 24, 2007

(54) MULTILAYER BARRIER FILM STRUCTURE AND ORGANIC ELECTROLUMINESCENT DISPLAY PANEL AND MANUFACTURING METHOD THEREOF

(75) Inventor: Toshiyuki Miyadera, Tsurugashima (JP)

(73) Assignee: Pioneer Corporation, Tokyo (JP)

(*) Notice: Subject to any disclaimer, the term of this patent is extended or adjusted under 35 U.S.C. 154(b) by 125 days.

(21) Appl. No.: 10/667,885

(22) Filed: Sep. 23, 2003

(65) Prior Publication Data

US 2005/0017633 A1 Jan. 27, 2005

(30) Foreign Application Priority Data

Sep. 25, 2002 (JP) ............... 2002-279597

(51) Int. Cl.
*H05B 33/04* (2006.01)
(52) U.S. Cl. ............... 313/512; 313/504; 313/506; 428/690; 428/917
(58) Field of Classification Search .......... 313/512
See application file for complete search history.

(56) References Cited

U.S. PATENT DOCUMENTS

| | | | |
|---|---|---|---|
| 6,570,325 B2* | 5/2003 | Graff et al. ............... 313/506 |
| 6,576,351 B2* | 6/2003 | Silvernail ............... 428/690 |
| 6,605,826 B2* | 8/2003 | Yamazaki et al. ............ 257/72 |
| 6,866,901 B2* | 3/2005 | Burrows et al. ............. 428/1.5 |
| 6,888,305 B2* | 5/2005 | Weaver ..................... 313/506 |
| 6,897,607 B2* | 5/2005 | Sugimoto et al. ........... 313/506 |
| 2004/0104673 A1* | 6/2004 | Hosokawa et al. ......... 313/512 |

\* cited by examiner

*Primary Examiner*—Sikha Roy
(74) *Attorney, Agent, or Firm*—Sughrue Mion, PLLC

(57) ABSTRACT

A multilayer barrier film structure of an organic EL display panel has a multilayered body formed on a surface of a supporting substrate. The multilayered body includes an intermediate film sandwiched between inorganic films. The film structure includes a sealing region provided so as to surround the multilayered body on the surface of the supporting substrate. In a method of manufacturing an organic EL display panel comprising an organic EL device and a supporting substrate, a first inorganic film is formed so as to cover a surface of a supporting substrate, an intermediate film is formed on the first inorganic film, a second inorganic film is formed on the intermediate film, an organic EL device is formed on the second inorganic film, and a perimeter outside the organic EL device is subjected to heating or irradiation, to form a sealing region.

11 Claims, 6 Drawing Sheets

MULTILAYER BARRIER FILM STRUCTURE AND ORGANIC ELECTROLUMINESCENT DISPLAY PANEL AND MANUFACTURING METHOD THEREOF

BACKGROUND OF THE INVENTION

1. Field of the Invention

The present invention relates to a multilayer barrier film structure, and an organic electroluminescent display panel and a manufacturing method thereof.

2. Description of the Related Art

Organic electroluminescent display panels (hereinafter referred to as "organic EL display panels") in which a plurality of organic electroluminescent devices (hereinafter referred to as "organic EL devices") are formed on a supporting substrate have been developed to be used in display apparatuses.

An organic EL device is a luminescent device comprising at least one thin film (hereinafter referred to as the "organic functional layer") including a light-emitting layer made of an organic material that is electroluminescent, i.e., emits light upon an electrical current being injected therein. With such an organic EL device, basically, the organic functional layer is sandwiched between an anode and a cathode, excitons are formed when electrons and holes injected from the two electrodes recombine, and light is produced when these excitons return from the excited state to the ground state.

There is a problem that if such an organic EL device is exposed to the atmosphere, then the organic EL device is affected by infiltration of molecules of oxygen, water and the like, and hence there is a marked deterioration in light emission characteristics such as brightness and color. To prevent this infiltration, a method has been proposed in which an inorganic film is formed on the organic EL device to block penetrating moisture and the like. Furthermore, as disclosed in WO 00/36665, a so-called multilayer gas barrier film in which inorganic films predominantly responsible for gas barrier ability and resin films are formed alternately (i.e., the resin films are inserted between the inorganic films) has been proposed. Here, "gas barrier ability" refers to a property of acting as a barrier to the permeation of oxygen and moisture; if the number of molecules of oxygen, water and the like that permeate through is high, then the gas barrier ability is low, and if the number of molecules of oxygen, water and the like that permeate through is low, then the gas barrier ability is high. The gas barrier ability of a multilayer gas barrier film is affected by the gas barrier ability of each film itself, and is also greatly affected by the density of defects such as pinholes. When the inorganic films are compared in the gas barrier ability with that of the resin films, the inorganic films exhibit a gas barrier ability higher than the resin films in general. However, the inorganic films are formed using a dry film formation method such as vacuum deposition or sputtering, and hence local defects such as pinholes are prone to occur.

With a multilayer gas barrier film comprising inorganic films and resin films, the effect of pinholes and the like in a single inorganic film layer can be reduced. However, even with a multilayer gas barrier film, if all of the layers are formed using a dry film formation method, then defects present in the first layer affect the next layer, and hence it is difficult to reduce the density of defects such as pinholes. Moreover, resin layers having a low gas barrier ability will be exposed at edge faces of the multilayer gas barrier film, and hence moisture and the like will infiltrate in via the edge face parts of the resin layers, and thus the merits of using a multilayered structure will not be realized to the full.

There can be envisaged in advance a method in which the edge face parts of the resin layers in the multilayer gas barrier film are covered with the inorganic films. But manufacturing specifications of such method would have to be changed such as preparing predetermined masks of various sizes with the area of the resin layers being changed in accordance with the number and shapes of various inorganic films, and hence this method would be inefficient from a manufacturing perspective.

SUMMARY OF THE INVENTION

A problem to be solved by the present invention is to provide a multilayer barrier film structure having high gas barrier ability, and an organic EL display panel and a manufacturing method thereof according to which light emission characteristics tend not to be deteriorated by moisture and the like.

A multilayer barrier film structure according to the present invention comprises:
  a supporting substrate;
  a multilayered body formed on a surface of the supporting substrate and including
    an intermediate film for which the number of molecules of oxygen, water and the like permeating through is reduced upon heating or irradiation and
    inorganic films formed so as to sandwich said intermediate film in the thickness direction; and
  a sealing region in which said intermediate film has been transformed by heating or irradiation provided so as to surround said multilayered body on the surface of said supporting substrate.

Further, an organic electroluminescent display panel according to the present invention comprises:
  at least one organic electroluminescent device each comprising first and second display electrodes and an organic functional layer that includes a light-emitting layer made of an organic compound and is formed so as to be sandwiched between said first and second display electrodes;
  a supporting substrate supporting said organic electroluminescent device;
  a multilayered body including
    an intermediate film for which the number of molecules of oxygen, water and the like permeating through is reduced upon heating or irradiation and
    inorganic films formed so as to sandwich said intermediate film in the thickness direction, wherein the multilayered body is disposed at least between said organic electroluminescent device and said supporting substrate and on said supporting substrate surrounding said organic electroluminescent device such that one of said inorganic films contacts said organic electroluminescent device; and
  a sealing region where said intermediate film has been transformed by heating or irradiation provided so as to surround said organic electroluminescent device.

An organic EL display panel manufacturing method of the present invention is a method of manufacturing an organic EL display panel comprising at least one organic EL device and a supporting substrate supporting the organic EL device. The method comprises: a first inorganic step of forming a first inorganic film so as to cover a surface of a supporting substrate; a coating step of forming, on the first inorganic film, an intermediate film for which the number of molecules of oxygen, water and the like permeating through is reduced upon heating or irradiation; a second inorganic step of forming a second inorganic film on the intermediate film; a step of forming, on the second inorganic film, an organic EL device comprising first and second display electrodes and at least one organic functional layer comprising an organic compound formed so as to be sandwiched between the first and second display electrodes; and a step of heating or irradiating a perimeter outside the organic EL device, to form a sealing region where the intermediate film has been transformed surrounding the organic EL device.

DETAILED DESCRIPTION OF THE INVENTION

Following is a description of embodiments of the present invention, with reference to the drawings.

Figure 1:
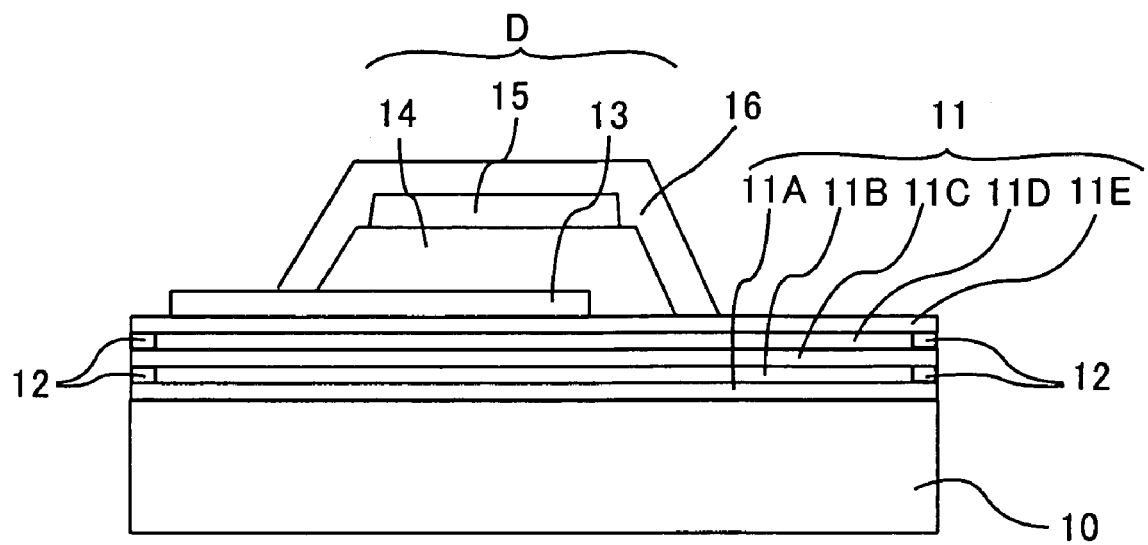
FIG. 1 is a schematic sectional view of an organic EL device according to an embodiment of the present invention.

FIG. 1 shows one of a plurality of organic EL devices in an organic EL display panel having a multilayer barrier film structure according to an embodiment of the present invention.

In the organic EL device D, for example, a transparent electrode (first display electrode) 13 made of indium tin oxide (ITO) is formed by vapor deposition, sputtering or the like on a multilayered body 11 on a transparent supporting substrate 10.

On the transparent electrode 13, for example, a hole injection layer made of copper phthalocyanine, a hole transport layer made of TPD (a triphenylamine derivative), a light-emitting layer made of Alq3 (an aluminum chelate complex), and an electron injection layer made of $Li_2O$ (lithium oxide) are formed in this order by vapor deposition; these layers constitute an organic functional layer 14. Furthermore, a metal electrode (second display electrode) 15 made of Al is formed on the electron injection layer by vapor deposition or the like so as to oppose the electrode pattern of the transparent electrode 13. Here, one example of the structure of the organic EL device has merely been shown; however, the organic EL device is not limited to this example, but rather an organic EL device having any kind of structure and using any kind of materials can be used.

The multilayered body 11 formed on a surface of the supporting substrate 10 comprises intermediate films 11B and 11D for which the number of molecules of oxygen, water and the like permeating through is reduced upon heating or irradiation, and inorganic films 11A, 11C and 11E that are formed so as to sandwich the intermediate films 11B and 11D. A sealing region 12 obtained through transformation of the intermediate film 11B by heating or irradiation is provided in the multilayered body 11 so as to surround the multilayered body 11 on the surface of the supporting substrate 10. The organic EL display panel is constituted from the supporting substrate 10 having the multilayered body 11 formed thereon, and the first display electrode 13 (the transparent electrode, which is an anode), one or more organic functional layers 14 including the light-emitting layer made of an organic compound, and the second display electrode 15 (the metal electrode, which is a cathode), which are formed in this order on the inorganic film 11E, which is the outermost layer of the multilayered body 11. In each organic EL device D, a rear surface of the second display electrode 15 is covered with a sealing film 16. Moreover, an organic material film (not shown) may be provided between the first inorganic film 11A and the supporting substrate 10 to improve adhesion.

The inorganic films 11A, 11C and 11E are, for example, made of an inorganic compound such as silicon oxide/nitride or silicon oxide formed using a dry film formation method such as sputtering. In the case that the multilayered body 11 is provided on the side from which the light emerges, silicon oxide/nitride, which has high optical transparency, is preferable as the inorganic compound material of the inorganic films 11A, 11C and 1E. In the case that the multilayered body 11 is provided on the opposite side to the side from which the light emerges, an inorganic compound such as silicon nitride can also be used.

The intermediate films 11B and 11D are made, for example, of an inorganic compound such as a metal oxide formed using a wet film formation method such as a sol-gel method. Moreover, the intermediate films 11B and 11D can also be formed from a thermosetting resin such as an epoxy resin or a silicone resin formed using a wet film formation method. Furthermore, instead of a thermosetting resin, an ultraviolet (UV) curing resin can also be used at the material of the intermediate films.

As the material of the supporting substrate 10, an organic material such as polyethylene terephthalate, polyethylene-2,6-naphthalate, a polycarbonate, a polysulfone, a polyethersulfone, a polyetherether ketone, a polyphenoxyether, a polyarylate, a fluororesin, polypropylene, polyethylene naphthalate, or a polyolefin can be used. Moreover, an inorganic material such as a glass can also be used as the material of the supporting substrate 10.

Note that a buffer layer made of an organic compound can be provided to improve the adhesion and the like between the supporting substrate 10 and the first inorganic film 11A. Moreover, the multilayered body 11 covers the surface between the supporting substrate 10 and the organic EL device and the surface of the supporting substrate 10 surrounding the organic EL device, but another multilayered body (not shown) can also be formed so as to cover the surface on the opposite side to the surface contacting the organic EL device so as to prevent the infiltration of oxygen, water etc. into the supporting substrate.

Next, as an example, a description will be given of a method of manufacturing organic EL display panels using a multilayered body of inorganic films made of SiON and intermediate films made of a thermosetting resin (e.g., an epoxy resin).

From the viewpoint of cost, the supporting substrate is manufactured from a continuous plastic sheet having a predetermined width. The organic EL display panel manufacture is carried out by forming a plurality of luminescent regions each comprising a plurality of organic EL devices on the continuous plastic sheet, and then at a final stage cutting into separate organic EL display panels each having a luminescent region. This method is known as a so-called multiple panel making technology.

Figure 2:
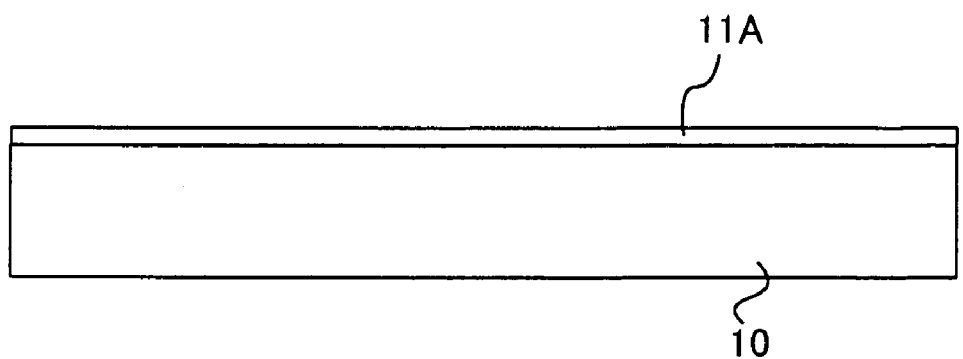
FIGS. 2 to 7 are schematic sectional views of a substrate during an organic EL display panel manufacturing process according to an embodiment of the present invention.

As shown in FIG. 2, a first inorganic film 11A made of silicon oxide/nitride (SiON) is formed by RF sputtering so as to cover a surface of the supporting substrate 10.

Figure 3:
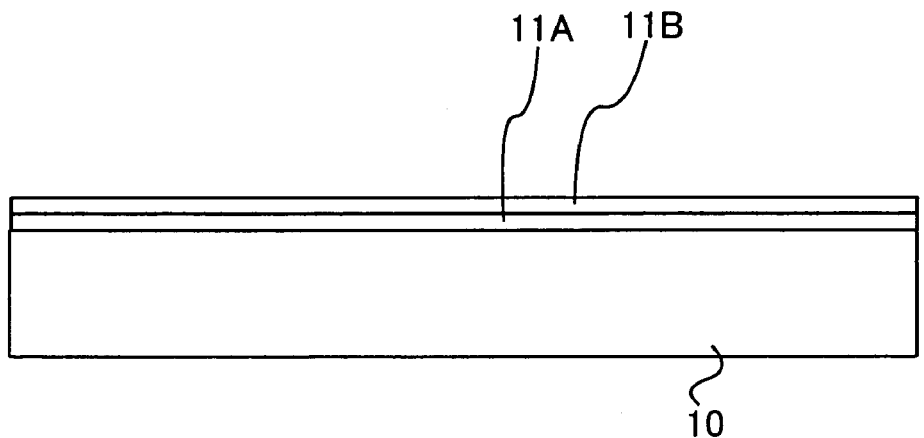

Next, as shown in FIG. 3, an epoxy resin precursor comprising a monomer or oligomer having epoxy groups and a curing agent such as an organic amine is applied onto the first inorganic film 11A, and polymerization is carried out at a predetermined temperature, thus forming an epoxy resin film as an intermediate film 11B for which the number of molecules of oxygen, water and the like permeating through is reduced upon heating or irradiation. The intermediate film 11B is formed using a wet film formation method, for example by immersing the sheet in a liquid bath of the epoxy resin precursor, or by applying the epoxy resin precursor onto the sheet by spin coating, blade coating, roll coating, bar coating or spraying.

Figure 4:
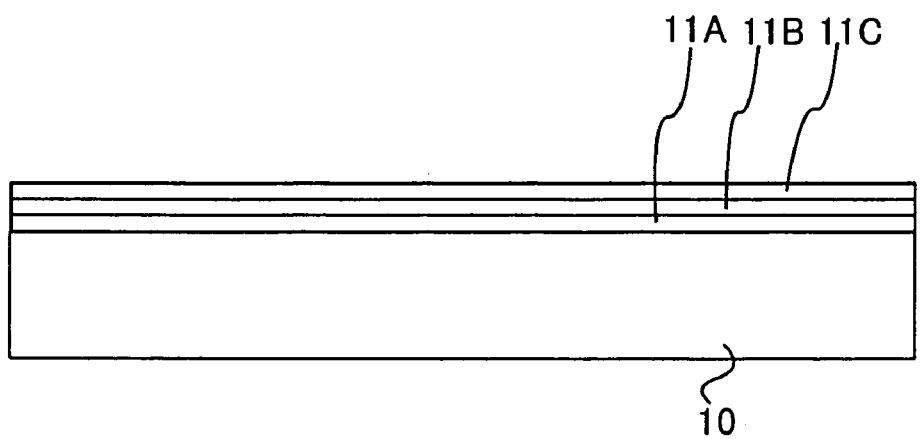

Next, as shown in FIG. 4, a second inorganic film 11C made of silicon oxide/nitride is formed on the intermediate film 11B by RF sputtering.

Figure 5:
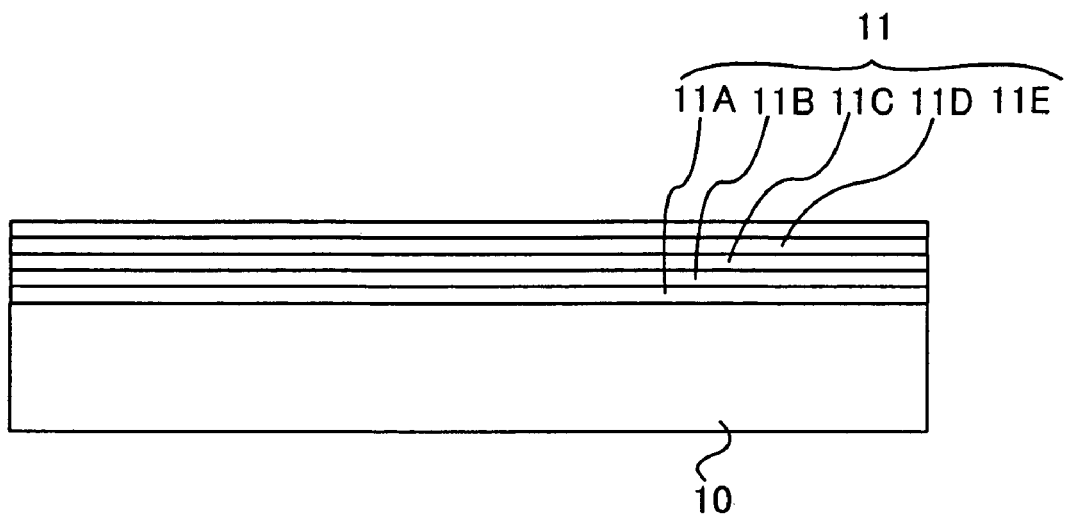

Next, processing is carried out as in the steps shown in FIGS. 3 and 4, whereby an intermediate film 11D made of an epoxy resin is formed on the second inorganic film 1C, and a third inorganic film 11E is formed on the intermediate film 11D, as shown in FIG. 5.

Figure 6:
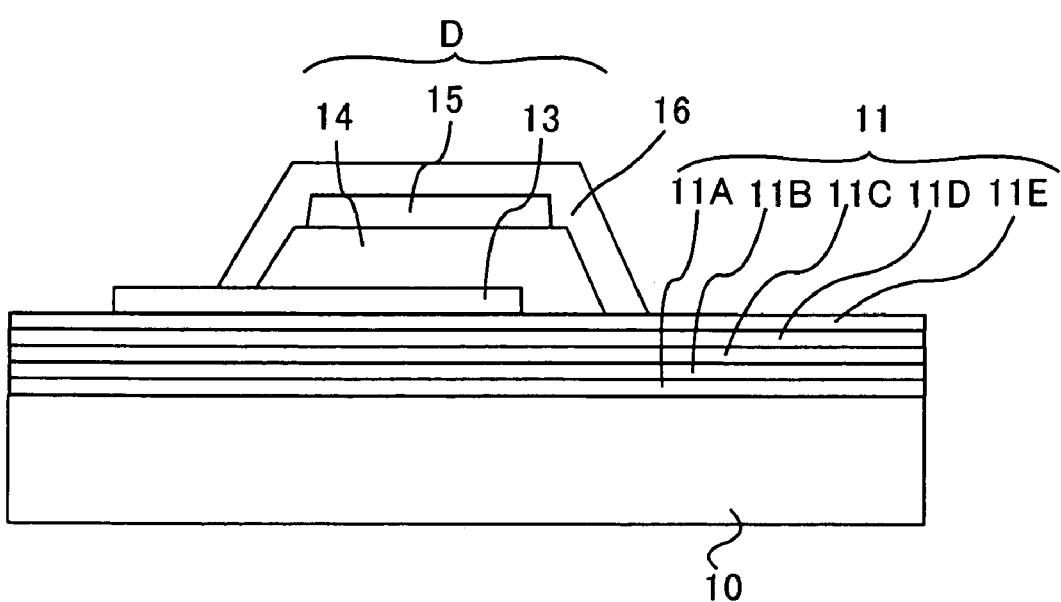

After that, first display electrodes 13 (transparent electrodes, which are anodes), predetermined organic functional layer 14, second display electrodes 15 (metal electrodes, which are cathodes), and a sealing film 16 that covers the above are formed in this order on the surface of the third inorganic film 11E, whereby a plurality of organic EL devices D of the present embodiment as shown in FIG. 6 are produced. A plurality of luminescent regions each comprising a plurality of the organic EL devices are formed on the continuous plastic sheet (the supporting substrate), but in FIG. 6 only one organic EL device D is shown as a representative example.

Figure 7:
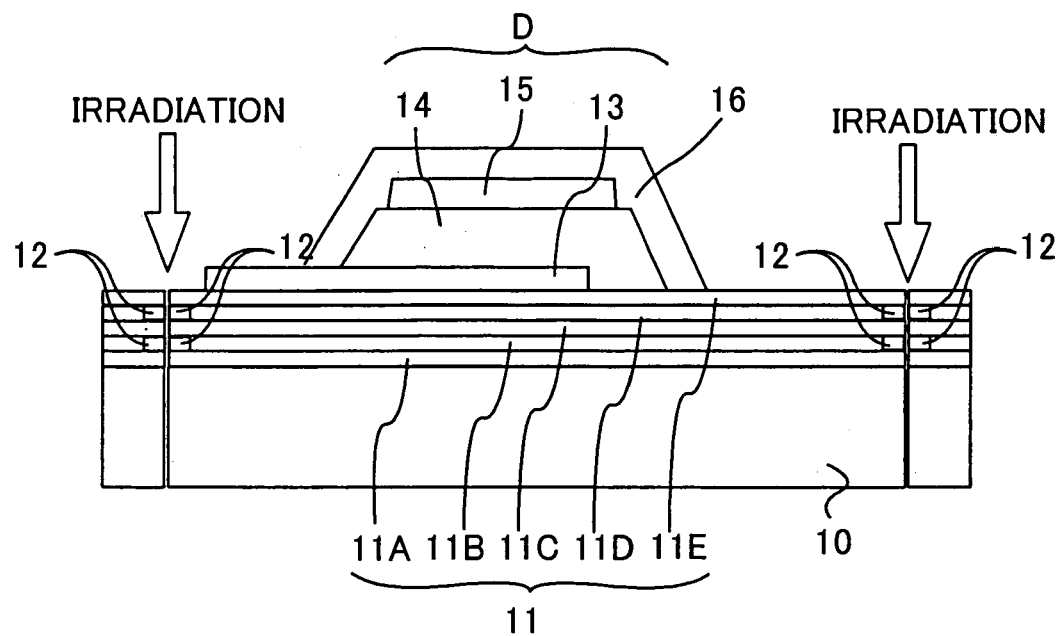

Next, as shown in FIG. 7, the continuous plastic sheet is subjected to cutting processing in which the perimeter outside each group of organic EL devices is cut by, for example, irradiating with a YAG laser or a $CO_2$ laser. Upon this laser irradiation, the polymerization of the epoxy resin further proceeds, whereby a dense sealing region 12 obtained through transformation of the intermediate film is formed so as to surround each group of organic EL devices (luminescent region), and at the same time the continuous plastic sheet is cut into organic EL display panels of a desired size through the laser irradiation. Hardening of the sealing region 12 of the epoxy resin is promoted by the heat from the laser irradiation, whereby the gas barrier ability of edge faces of the multilayered body 11 is improved. At this time, because the heating is local, the processing described above can be carried out without there being any problem of the substrate as a whole deforming in shape. As a result, even when using the multiple panel making technology, even though edge faces of the multilayered body are exposed to the atmosphere, an effect of the gas barrier ability being improved by using a plurality of inorganic film layers can be obtained.

Note that here, the supporting substrate is cut through the laser irradiation, but instead of this it is possible to form the sealing region 12 by irradiating a light beam from a halogen lamp or the like onto an irradiation region including lines where the sheet is to be cut, and then cutting the sheet in a separate step.

As described above, in the multilayered body in the present embodiment, inorganic films formed using a dry film formation method are used as films predominantly responsible for gas barrier ability, and a material that can be formed using a wet film formation method and for which the gas barrier ability improves upon heating or irradiation is used as the material of layers inserted between the inorganic films for reducing the density of defects in the multilayered structure.

In other embodiments of the present invention, multilayered bodies described in a) and b) below can be used.

a) Multilayered Body of Inorganic (SiON) Films and Perhydropolysilazane Films

Instead of the steps of forming epoxy resin films as the intermediate films 11B and 11D shown in FIG. 3, for example, a solution of perhydropolysilazane in a solvent such as xylene or dibutyl ether is applied, and then drying is carried out at a predetermined temperature, thus forming a dried coating film. This film is again formed using a wet film formation method, for example the sheet is immersed in a liquid bath of the solution, or the solution is applied onto the sheet by spin coating, blade coating, knife coating, bar coating, roll coating or spraying.

After the organic EL device D has been formed on the multilayered body of the SiON films and the polysilazane coating films, the continuous plastic sheet is cut to the desired panel size by laser irradiation. The polysilazane films change into dense silica through the heat from the laser, i.e., a sealing region 12 is formed through transformation of the intermediate film by heating or irradiation, whereby the gas barrier ability of the edge face parts of the multilayered body is improved. In this case, an inorganic macromolecular material that can be applied such as perhydropolysilazane is formed on the inorganic films, and in contrast with the case that one attempts to secure gas barrier ability by heating the whole of the plastic supporting substrate, only parts of the substrate are heated, and hence there is no problem of the substrate as a whole melting and thus deforming in shape. If the polysilazane films are baked in air, then conversion to dense amorphous silica takes place at approximately 450° C., and if the polysilazane films are baked in an inert gas or a vacuum, then conversion to amorphous SiN takes place, whereby the sealing region where the polysilazane film has been transformed is obtained. Furthermore, if the heating or irradiation is carried out in steam in the presence of a catalyst such as pyridine, then a dense amorphous silica sealing region can be obtained at 100° C. or less. Instead of the polysilazane, an organosilicon macromolecular material such as a polysiloxane or a polycarbosilane can be used.

b) Multilayered Body of Inorganic (SiON) Films and Metal Oxide ($SiO_2$) Thin Films Formed Using a Sol-Gel Method In the sol-gel method, a colloid solution (sol) of, for example, an alcohol containing oxide precursor particles obtained through hydrolysis of a metal salt or a metal organic compound such as a metal alkoxide is prepared, and then this colloid solution is applied onto the supporting substrate, and drying is carried out to form a thin film (gel) in which the fluidity has been lost; heat treatment is then carried out to produce a glass or ceramic thin film. Examples of the method of applying the sol onto the supporting substrate are a spraying method, and an immersion method in which the substrate is immersed in the sol and then drawn out. The immersion method is suitable for carrying out uniform application over the whole of a substrate having a large area. Moreover, as the metal species in a metal alkoxide, Si can be used, or else Na, Ba, Cu, Al, Ti, Ge, V, W or Y.

Following is a list of advantages of the coating film formation method using a wet inorganic film formation method such as a sol-gel method.

(a) Because a gel state is passed through, a porous film is formed. Upon baking, the porosity is lost, and the film becomes dense.

(b) The raw materials can easily be purified by distillation or recrystallization, and hence a coating film of high purity can be obtained.

(c) Mixing of the raw materials is carried out in a low-viscosity liquid state, and hence homogenization on an atomic or molecular level is possible. This is particularly advantageous in the case of preparation of a composite oxide, with it being possible to obtain a coating film of a compound having good stoichiometry.

(d) The baking temperature is several hundred to a thousand ° C. lower than in the sintering of an ordinary ceramic.

(e) The apparatus is simple, and application can be carried out even onto a substrate having a large area. Moreover, simultaneous application onto both surfaces of the substrate or application onto only part of the substrate is also possible.

With the sol-gel method, instead of the step of forming an epoxy resin film such as the intermediate films 11B, 11D shown in FIG. 3, for example, a hydrochloric acid ethanol solution of $Si(OC_2H_5)$ is applied, and then drying is carried out at a predetermined temperature, thus forming a dried gel coating film. This film is again formed using a wet film formation method, for example the sheet is immersed in a liquid bath of the solution, or application is carried out by spraying.

After the organic EL devices D have been formed on the multilayered body of the SiON films and the dried gel coating films, the continuous plastic sheet is cut to the desired panel size by laser irradiation. The dried gel coating films change into dense silica through the heat from the laser, i.e., a sealing region 12 is formed through transformation of the intermediate film by heating or irradiation, whereby the gas barrier ability of the edge face parts of the multilayered body is improved. The sealing region where the intermediate film has been transformed by heating or irradiation is formed at the same time as the cutting to the desired panel size through the laser irradiation. The gas barrier ability at the edge parts of the $SiO_2$ layers is improved through the heating by the laser. At this time, the heating is local, and hence the processing described above can be carried out without there being any problem of the substrate as a whole deforming in shape.

As described above, the multilayered body is constituted by alternately forming inorganic films and intermediate films that can be applied by a coatable method and then the inorganic films are subject to the heating or irradiation to improve its gas barrier ability. As a result, loss of the oxygen/moisture permeation prevention effect due to local defects (pinholes) in the various layers can be reduced. Moreover, the exposed edge face parts of the intermediate film are changed into a sealing region through heating or irradiation when cutting to the desired panel size through the laser irradiation. At the same time, the main body of the intermediate film can also be changed into a sealing region having a high gas barrier ability through heating or irradiation from the outside by naturally leaving the devices after the cutting. Accordingly, the gas barrier ability can be secured in a practical way.

Figure 8:
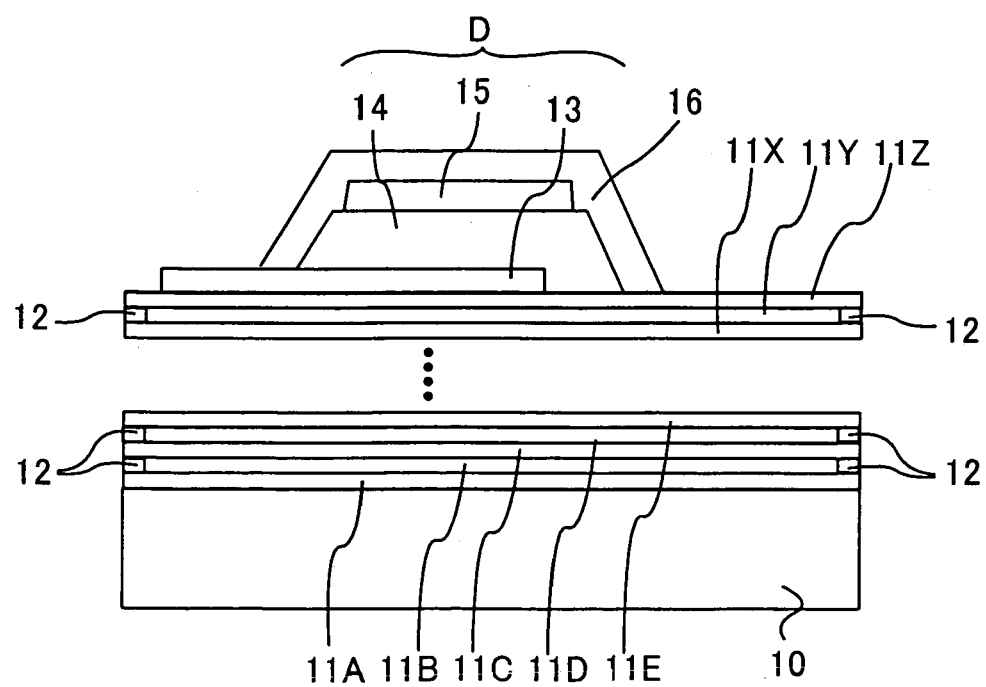
FIG. 8 is a schematic sectional view of an organic EL device according to another embodiment of the present invention.

In another embodiment, three or more inorganic films and intermediate films can be formed on top of one another as necessary. For example, as shown in FIG. 8, it is possible to alternately form an inorganic film 11A, an intermediate film 11B, an inorganic film 1C, an intermediate film 1D, an inorganic film 11E, and the like up to an inorganic film 11X, an intermediate film 11Y and an inorganic film 11Z on a supporting substrate 10 as described above, and then form organic EL devices D thereon. Each intermediate film is formed over the whole of the inorganic film therebelow without it being necessary to carry out patterning, and the periphery of the intermediate film outside the display region is locally heated to form the sealing region where the intermediate film has been transformed, whereby the edge parts of the intermediate film come to have a dense film structure having low permeability to water vapor and the like. Infiltration of moisture and the like from the edge parts can thus be suppressed.

In the present embodiment, a plurality of inorganic films are formed on top of one another, and an intermediate film is disposed between the inorganic films, and furthermore edge parts of the intermediate film on at least the side close to the organic functional layers of the devices are transformed into a sealing region, whereby the pathway of infiltration of moisture and the like can be virtually completely blocked off even in the case that defects are present in the inorganic films, and hence the reliability of the organic EL devices can be greatly improved.

Figure 9:
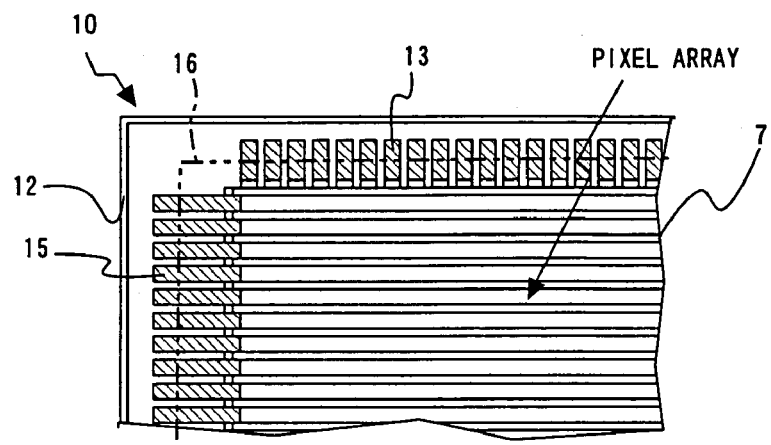
FIG. 9 is an enlarged rear view of part of an organic EL display panel having a plurality of organic EL devices according to another embodiment of the present invention.

FIG. 9 is an enlarged rear view of part of an organic EL display panel having a plurality of organic EL devices according to another embodiment of the present invention. The organic EL display panel has a pixel array of a plurality of organic EL devices arranged in a matrix shape on a supporting substrate 10 that is covered with a multilayered body. The organic EL devices are formed at the points of intersection between row electrodes 13 (first display electrodes, which are anodes) that contain transparent electrode layers, organic functional layers, and column electrodes 15 (second display electrodes) that contain metal electrode layers and intersect the row electrodes 13. The row electrodes 13 are each formed in a band shape, and are arranged parallel to one another with a predetermined spacing therebetween; likewise the column electrodes 15. The display panel, which is of matrix display type, thus has a pixel display array comprising a plurality of organic EL device luminescent pixels formed at the points of intersection between the row and column electrodes. The first display electrodes 13 can be constituted from metal bus lines that electrically connect island-like transparent electrodes together in a horizontal direction. The organic EL display panel may have a plurality of partition walls 7 provided between the organic EL devices on the multilayered body on the supporting substrate 10. A sealing film 16 is formed on the second display electrodes 15 and the partition walls 7. The organic functional layer materials can be selected and built up as appropriate so as to constitute red (R), green (G) and blue (B) luminescent parts.

Figure 10:
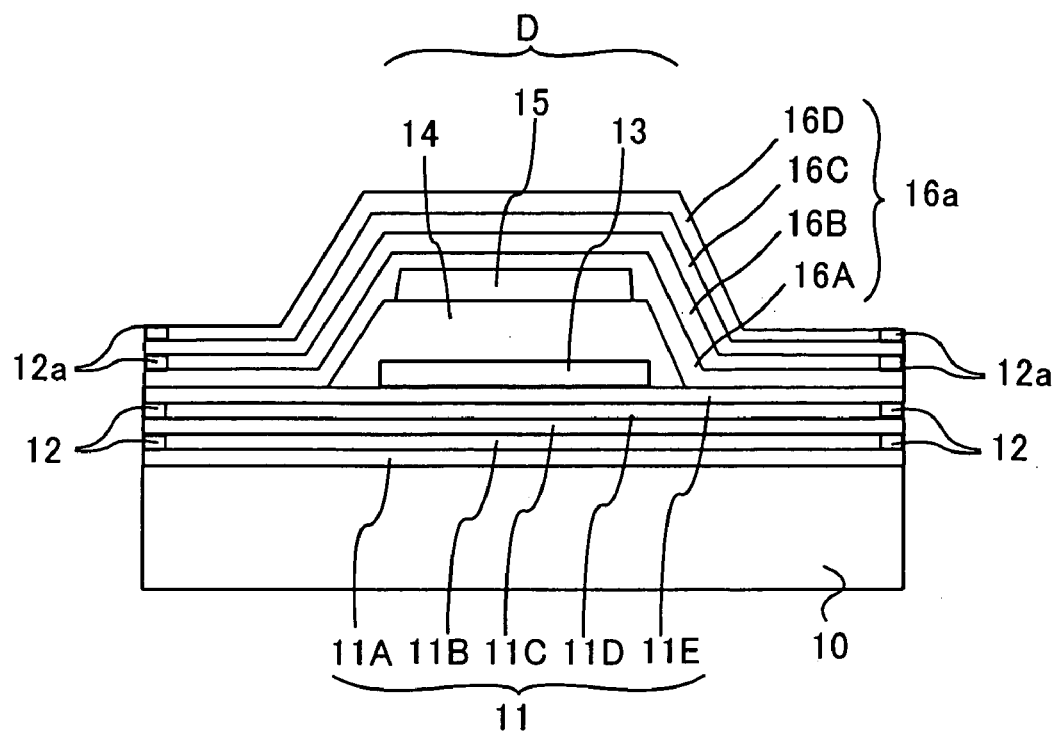
FIGS. 10 and 11 are schematic sectional views of organic EL devices according to other embodiments of the present invention.

In an organic EL display panel of yet another embodiment, a multilayered body comprising an intermediate film for which the number of molecules of oxygen, water and the like permeating through is reduced upon heating or irradiation and inorganic films that are formed so as to sandwich the intermediate film can be used as a sealing film that covers the plurality of organic EL devices from the rear. Specifically, as shown in FIG. 10, a multilayered body 16a comprising an inorganic film 16A, an intermediate film 16B, an inorganic film 16C and an intermediate film 16D formed on top of one another as described earlier is formed so as to cover, from the rear, the whole of the organic EL device D so as to contact the organic EL device D and the supporting substrate 10 around the organic EL device D. Furthermore, a second sealing region 12a obtained through transformation of the intermediate film by heating or irradiation using a laser or the like is formed at the same time as the first sealing region 12 so as to surround the organic EL device D. Infiltration of moisture and the like from the cut edge parts can be prevented through the first and second sealing regions 12 and 12a.

Figure 11:
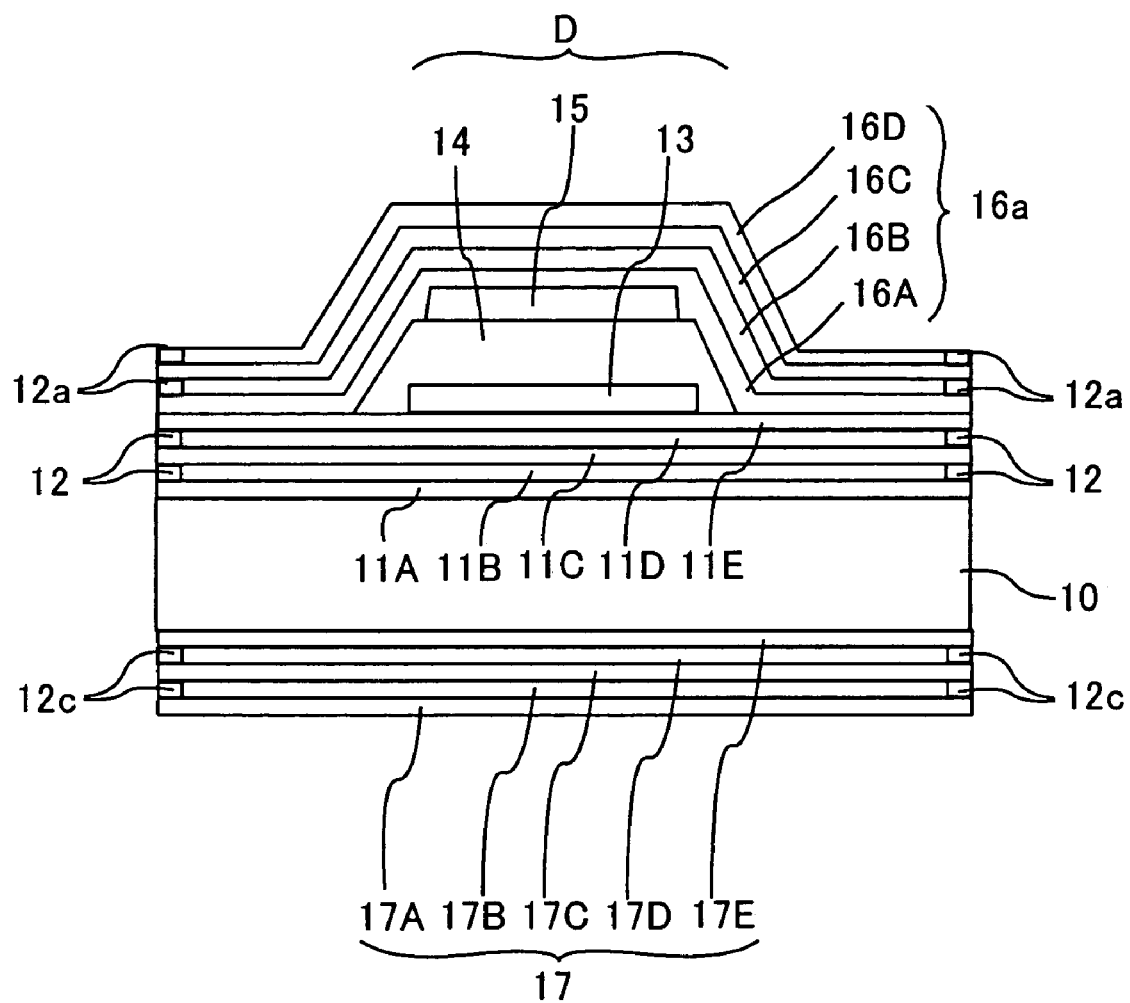

Moreover, in an organic EL display panel of yet another embodiment, in addition to the multilayered body 16a shown in FIG. 10, as shown in FIG. 11, a multilayered body 17 comprising an inorganic film 17A, an intermediate film 17B, an inorganic film 17C, an intermediate film 17D and an inorganic film 17E formed on top of one another as described earlier can be formed so as to cover a surface of the supporting substrate 10 on the opposite side to the surface contacting the organic EL device. Furthermore, a third sealing region 12c obtained through transformation of the intermediate film by heating or irradiation using a laser or the like is formed at the same time as the first and second sealing regions 12 and 12a so as to surround the organic EL device D. Infiltration of moisture and the like from the cut edge parts can be prevented through the first, second and third sealing regions 12, 12a and 12c.

In the examples described above, sputtering was used as the method of forming the inorganic films in the multilayered bodies; however, there is no limitation thereto, but rather a vapor phase growth method such as vacuum deposition or plasma CVD (chemical vapor deposition) can'also be used.

In this way, there is described a simple matrix display type organic EL display panel in which the luminescent parts are the parts of the organic functional layers 14 where the transparent electrodes 13 and metal electrodes 15 on the transparent supporting substrate 10 intersect one another in the embodiment shown in FIG. 9. In addition to this, the multilayered body of the present invention may also be applied to an active matrix display type panel substrate.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese patent application No. 2002-279597 which is herein incorporated by reference.

What is claimed is:

1. A multilayer barrier film structure, comprising:
a supporting substrate;
a multilayered body formed on a surface of the supporting substrate and including
an intermediate film for which the number of molecules of oxygen, water and the like permeating through is reduced upon heating or irradiation and
inorganic films formed so as to sandwich said intermediate film; and
a sealing region placed only at an edge of said intermediate film between the inorganic films and encircling said intermediate film and made from said intermediate film transformed by heating or irradiation.

2. The multilayer barrier film structure according to claim 1, wherein said inorganic films are made of silicon oxide/nitride or silicon nitride.

3. The multilayer barrier film structure according to claim 1, wherein said intermediate film is made of a thermosetting resin, a polysilazane, or a metal oxide film obtained using a sol-gel method.

4. The multilayer barrier film structure according to claim 1, wherein said supporting substrate is made of a resin.

5. An organic electroluminescent display panel comprising:
at least one organic electroluminescent device each comprising first and second display electrodes and an organic functional layer that includes a light-emitting layer made of an organic compound and is formed so as to be sandwiched between said first and second display electrodes;
a supporting substrate supporting said organic electroluminescent device;
a multilayered body including
an intermediate film for which the number of molecules of oxygen, water and the like permeating through is reduced upon heating or irradiation and
inorganic films formed so as to sandwich said intermediate film, wherein the multilayered body is disposed at least between said organic electroluminescent device and said supporting substrate and on said supporting substrate surrounding said organic electroluminescent device such that one of said inorganic films contacts said organic electroluminescent device; and
a sealing region placed only at an edge of said intermediate film between the inorganic films and encircling said intermediate film and made from said intermediate film transformed by heating or irradiation.

6. The organic electroluminescent display panel according to claim 5, wherein a multilayered body comprising an intermediate film for which the number of molecules of oxygen, water and the like permeating through is reduced upon heating or irradiation and inorganic films formed so as to sandwich said intermediate film covers, from rear, said supporting substrate surrounding said organic electroluminescent device and the whole of said organic electroluminescent device so as to contact said organic electroluminescent device, and said organic electroluminescent device further comprises a second sealing region where said intermediate film has been transformed by heating or irradiation provided so as to surround said organic electroluminescent device.

7. The organic electroluminescent display panel according to claim 5, wherein a multilayered body comprising an intermediate film for which the number of molecules of oxygen, water and the like permeating through is reduced upon heating or irradiation and inorganic films formed so as to sandwich said intermediate film covers a surface of said supporting substrate on the opposite side to the surface contacting said organic electroluminescent device, and said organic electroluminescent device further comprises a third sealing region where said intermediate film has been transformed by heating or irradiation provided so as to surround said organic electroluminescent device.

8. The organic electroluminescent display panel according to claim 5, wherein said inorganic films are made of silicon oxide/nitride or silicon nitride.

9. The organic electroluminescent display panel according to claim 5, wherein said intermediate film is made of a thermosetting resin, a polysilazane, or a metal oxide film obtained using a sol-gel method.

10. The organic electroluminescent display panel according to claim 5, wherein said supporting substrate is made of a resin.

11. A multilayer barrier film structure, comprising:
    a supporting substrate;
    a multilayered body formed on a surface of the supporting substrate and including
    an intermediate film for which the number of molecules of oxygen, water and the like permeating through is reduced upon heating or irradiation and
    inorganic films formed so as to sandwich said intermediate film; and
    a sealing region placed only at an edge of said intermediate film between the inorganic films as a result of transformation by heating or irradiation.

* * * * *